United States Patent [19]

Dingwall et al.

[11] 4,208,730

[45] Jun. 17, 1980

[54] PRECHARGE CIRCUIT FOR MEMORY ARRAY

[75] Inventors: Andrew G. F. Dingwall, Bridgewater; Roger G. Stewart, Neshanic Station, both of N.J.

[73] Assignee: RCA Corporation, New York, N.Y.

[21] Appl. No.: 931,748

[22] Filed: Aug. 7, 1978

[51] Int. Cl.² .............................................. G11C 11/40
[52] U.S. Cl. ................................. 365/203; 365/181; 365/189; 307/238
[58] Field of Search ........................ 365/203, 181, 189; 307/238, 279

[56] References Cited

U.S. PATENT DOCUMENTS

4,044,341  8/1977  Stewart .............................. 365/203

Primary Examiner—Terrell W. Fears
Attorney, Agent, or Firm—H. Christoffersen; Henry I. Schanzer

[57] ABSTRACT

The bit lines of a word organized memory array are precharged to a potential which is substantially equal to the flip points (i.e. the point at which the cell changes state) of the memory cells of the array prior to each read and each write operation. This ensures the non-disturbance of the unselected memory cells of the array, provides greater design freedom of the memory array components, and enables the memory array to operate faster and more reliably.

14 Claims, 10 Drawing Figures

PRECHARGE CIRCUIT FOR MEMORY ARRAY

This invention relates to means for placing the bit lines of a memory array at a potential, or potentials, which enables information to be quickly and safely written into, or read-out of, selected cells of the array without disturbing the unselected cells.

In the design of large memory arrays, a critical parameter is the largest number of memory cells that can be put on a chip, i.e. the packing density. To achieve a high packing density, the number of devices per memory cell must be small, the devices themselves must be as small as possible, and the number of lines to access the cells must be as few as possible.

A known static memory cell which satisfies these general requirements includes five (5) transistors per cell and is shown, for example, in FIG. 5 of U.S. Pat. No. 3,521,242 entitled, "Complementary Transistors Write and NDRO for Memory Cell" and incorporated herein by reference. Four of the five transistors are connected to form a flip-flop. The fifth transistor referred to herein as the "gating" transistor functions as a transmission gate. Its conduction path is connected between a single input-output (I/O) point of the flip flop and an I/O, or bit, line and it is used either to sense the state of the cell or to write information into the cell. The cell has many advantages in that it is small, it can be selected by one word line connected to the control electrode of the gating transistor, and information can be written into the cell and its contents can be sensed by means of one bit line.

However, many problems and conflicting design requirements accompanying these advantages. To write into the cell, the impedance of the gating transistor must be made as low as possible to enable the cell to accept new information (i.e. change state). But, when reading the information contained in the cell, the gating transistor must have a relatively high impedance to prevent residual voltages on the bit line from overriding and altering the contents of the memory cell.

A prior art technique for minimizing the above problems is to control the ON impedance ($Z_{N3}$) of the conduction path of the gating transistor so it is much higher during a read cycle than during a write cycle. During read, $Z_{N3}$ is made high relative to the ON impedance ($Z_F$) of the transistors forming the flip-flop, so the cell can be read out non-destructively. During write, $Z_{N3}$ is made less than $Z_F$ to enable information to be written into the cell. However, making $Z_{N3}$ low, during write, gives rise to a serious problem when it is realized that selected cells as well as unselected cells are then coupled to their corresponding bit lines.

For example, a large memory array (e.g. 16K RAM) having M·N (e.g. 16,384) memory cells is arranged in M (e.g. 128) rows and N (e.g. 128) columns with one row conductor (word line) per row and one column conductor (bit line) per column. The control electrodes of the N gating transistors of a row are connected to each word line and one end of their conduction paths are connected to their corresponding bit lines.

In such large arrays, information is normally written into (or read from) only a small number (e.g. 1, 4 or 8) of cells at any one time. But, all the N gating transistors of a row are concurrently driven into conduction. Due to the large size of the array the capacitance associated with the bit lines is substantial and the voltage levels of the unselected bit lines may be held tightly at either the "0" or "1" voltage level. The combination of the low impedance of the gating transistors and the large bit line capacitance can result in the disturbance ("false-write") of many unselected cells. Thus, although making $Z_{N3}$ low during write enables the cells to be easily written, it gives rise to a serious disturb problem.

Furthermore, the ON impedance of the gating transistor is arranged to be normally high during read by making the gating transistor as small as possible. But, there are limits to how small the gating transistor can be made relative to the transistors forming the flip-flop. To achieve a high packing density the transistors forming the flip-flop are made as small as the design rules permit. In some cases the gating transistor cannot be made smaller, and consequently $Z_{N3}$ is then not significantly greater than the ON impedance of the flip-flop transistors. For similar sized gating and flip-flop transistors, some unselected cells may be disturbed during read; and, due to the high impedance of $Z_{N3}$, the read-out is very slow. These problems are aggravated by the non-linear impedance characteristic of $Z_{N3}$. Clearly, a problem exists in making a large high density memory array which can be reliably and quickly written and read. This problem is solved in circuits embodying the invention.

In memory arrays embodying the invention each memory cell has: a) an input-output (I/O) point to which a storage element is connected; b) a gating transistor for selectively connecting the I/O point and a bit line; and c) a flip point which may be defined as a voltage level at the I/O point at which the cell neither sinks (draws) nor sources (supplies) current into the I/O point. Applicants' invention resides in part in the recognition that for a voltage equal to, or close to, the voltage level of the flip point applied to the bit line, the memory cell will not be disturbed (i.e. change state) even though the impedance of the gating transistor is very low. Applicants' invention also resides in the means for generating the non-disturbing voltage and the means for unconditionally placing the bit lines and the master bit lines of the array at the non-disturbing voltage prior to each read or write cycle.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, definitions and characteristics of IGFETs pertinent to the invention are set forth in column 2 of U.S. Pat. Nos. 4,037,114 and 4,001,606, and are incorporated herein by reference.

Figure 1:
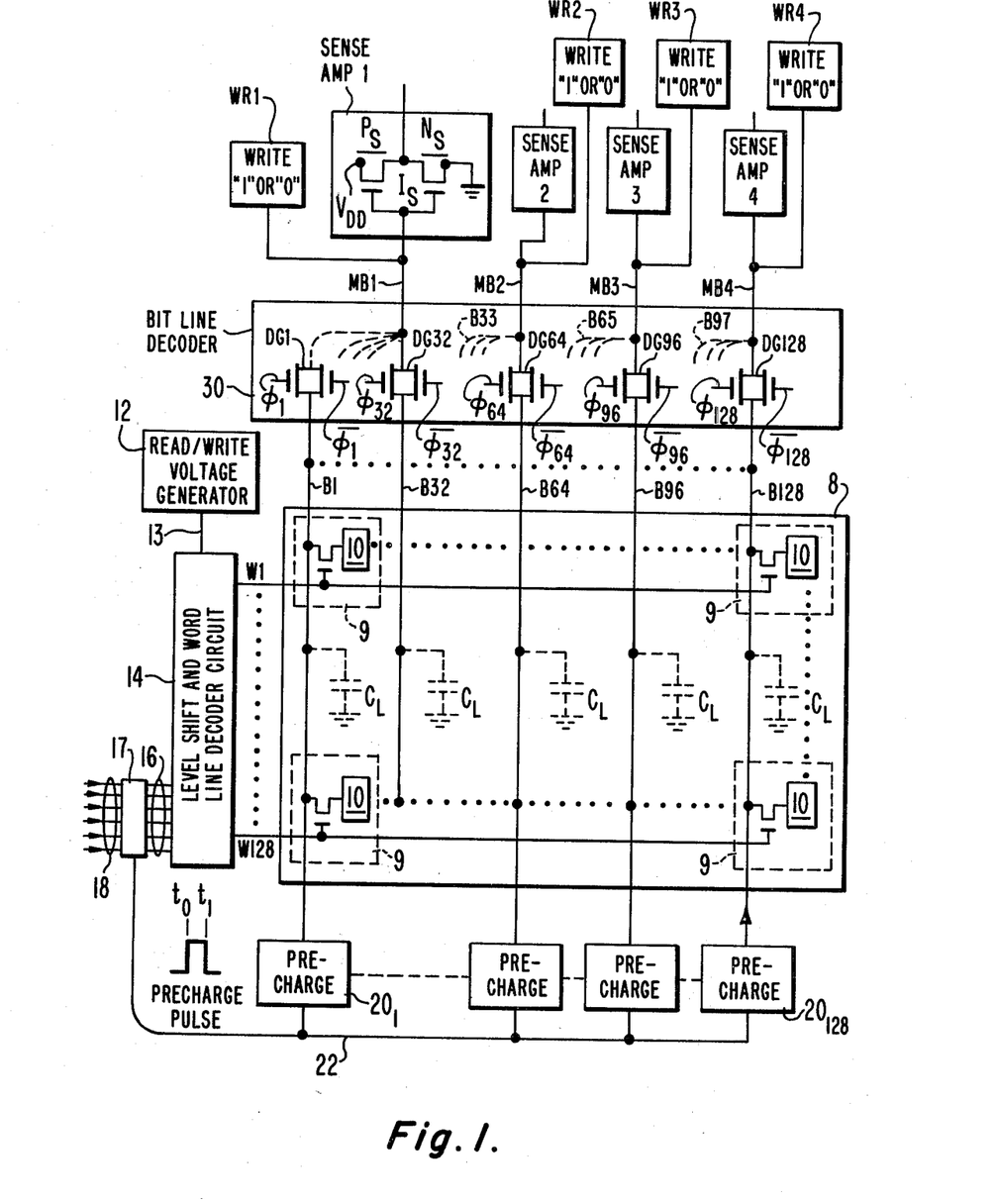
FIG. 1 is a block diagram of a memory array embodying the invention.
Figure 2A:
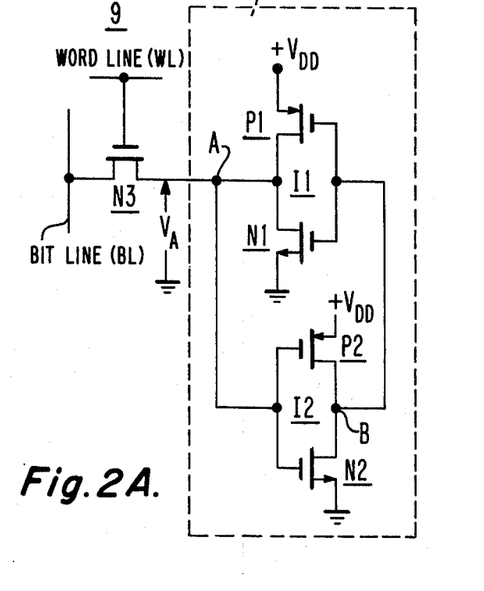
FIG. 2A is a schematic diagram of a memory cell that may be used in the circuit of FIG. 1.

The circuit of FIG. 1 includes a memory array 8 of cells 9 arranged in rows (words) and columns (bits). Each memory cell, as shown in FIG. 2A, includes a gating transistor N3 whose conduction path is connected between a bit line (BL) and the Input-Output (I/O) point (A) of a flip-flop 10 comprised of two cross-coupled complementary inverters I1 and I2. Each one of inverters I1 and I2 includes two IGFETs of complementary conductivity type having their source drain paths connected in series between $V_{DD}$ and ground. The drains of IGFETs P1 and N1, forming inverter I1, are connected in common with the gates of IGFET P2 and N2 to I/O point A also defined as the "exterior" node of the cell. The drains of P2 and N2, forming inverter I2, are connected to the gates of P1 and N1 at node B also defined as the "interior" node of the cell. A word line is connected to the control (gate) electrode of N3. The potential ($V_{WL}$) on the word line controls the conductivity of N3.

Before discussing the remainder of FIG. 1 it will first be shown that for certain voltages on the bit line, the memory cell will not be disturbed.

Referring to the circuit of FIG. 2A assume: (a) that the flip-flop transistors P1, N1, P2 and N2 have the same source-to-drain impedance for the same value of gate-to-source potential; (b) that the transition point of inverters I1 and I2 is $V_{DD}/2$. That is, for values of gate voltage more negative than $V_{DD}/2$ the inverter output is high (more positive than $V_{DD}/2$) and for values of gate voltage more positive than $V_{DD}/2$ the inverter output is low (less positive than $V_{DD}/2$); (c) that the "flip-point" ($V_{FP}$) of the flip-flop is $V_{DD}/2$, where the "flip-point" is defined as the voltage at node A for which the memory cell neither sinks (draws) current from, nor sources (supplies) current into, node A; and (d) that $V_{DD}/2$ volts, is applied to the bit line.

Consider first the condition of the memory cell when storing a "1" or "high". In this state transistors P1 and N2 are ON and node A is connected to $+V_{DD}$ via the conduction path of P1 —ON. Assume now that gating transistor N3 is turned on very hard by the application of $V_{DD}$ volts to its gate. The impedance ($Z_{N3}$) of N3 is connected in series with the impedance ($Z_{P1}$) of P1 between the bit line at $+V_{DD}/2$ and the power supply line at $+V_{DD}$ volts. For any value of $Z_{N3}$ above zero ohms the potential at node A must remain above $V_{DD}/2$ and the cell remains in the "high" state.

Consider now the condition of the memory cell when storing a "0" or "low". In this state, transistors N1 and P2 are on and node A is connected to ground via the drain-to-source path through N1. Assume, as before, that N3 is turned on very hard. $Z_{N3}$ is now connected in series with the impedance ($Z_{N1}$) of transistor N1 between the bit line which is at $V_{DD}/2$ and ground. For any value of $Z_{N3}$ greater than zero the potential at node A must remain below $V_{DD}/2$ and the cell remains in the "low" state. Thus, for the bit line precharged to $V_{DD}/2$, the memory cell will not be disturbed even if $Z_{N3}$ is much less than $Z_{P1}$ or $Z_{N1}$. The impedance of N3 is no longer critical and can be varied over a wide range without causing a false write problem.

It is now shown that for finite values of $Z_{N3}$ there is a "safe-margin" which is defined herein as a range of voltage that may be applied to the bit line above or below $V_{FP}$ without causing the cell to change state when coupled via $Z_{N3}$ to the bit line. By way of example, assume that, when N3 is turned on, $Z_{N3}$ is one fourth (¼) $Z_{N1}$ or $Z_{P1}$ and that $V_{DD}$ is equal to 5 volts.

Figure 2B:
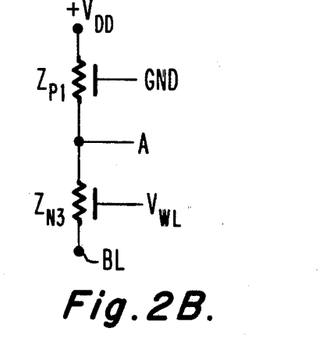
FIGS. 2B and 2C are idealized equivalents of the FIG. 2A circuit for two different signal conditions.

Examine first the condition when the cell is storing a "1". Transistor P1 is on, and $Z_{P1}$ is then connected between $V_{DD}$ and node A. The remaining transistors of the flip flop are either off or present a high impedance at node A. Transistor N3 is assumed to be turned on hard, and $Z_{N3}$ assumed equal to $Z_{P1}/4$ is connected between node A and the bit line. The idealized condition of $Z_{P1}$ and $Z_{N3}$ in series between $V_{DD}$ and BL is shown in FIG. 2B. The voltage ($V_{BL}$) that must exist on the bit line to bring the voltage ($V_A$) at node A down to $V_{DD}/2$ (e.g. 2.5 v) is, for the assumed values of impedances, equal to ⅜ $V_{DD}$ (e.g. 1.875 volts). Until $V_{BL}$ becomes more negative than this level the memory cell will not be disturbed when N3, whose $Z_{N3}=Z_{P1}/4$, is turned on.

Figure 2C:
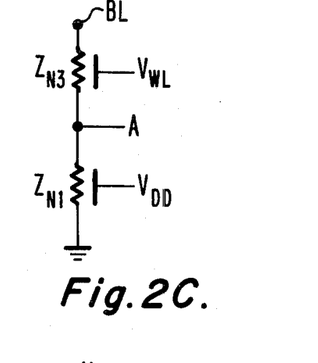

Examine now the condition when the cell is storing a "0". N1 is ON, and $Z_{N1}$ is connected between ground and node A. Transistor N3 is assumed to be turned on hard, and $Z_{N3}$ equal to $Z_{N1}/4$ is connected between node A and the bit line. The idealized condition of $Z_{N3}$ and $Z_{N1}$ in series between BL and ground is shown in FIG. 2C. The $V_{BL}$ to bring node A to $V_{DD}/2$ (e.g. 2.5 v) for the assumed values of impedances, is ⅝ $V_{DD}$ (e.g. 3.125 v). Until $V_{BL}$ becomes more positive than this level the memory cell will not be disturbed. For $V_{FP}$ equal to $V_{DD}/2$ and $V_{BL}$ precharged to $V_{DD}/2$ the margin of safety lies within a range between $$[V_{DD}/2][1+Z_{N3}/Z_{N1}] \text{ and } [V_{DD}/2][1-Z_{N3}/Z_{P1}].$$

Figure 3:
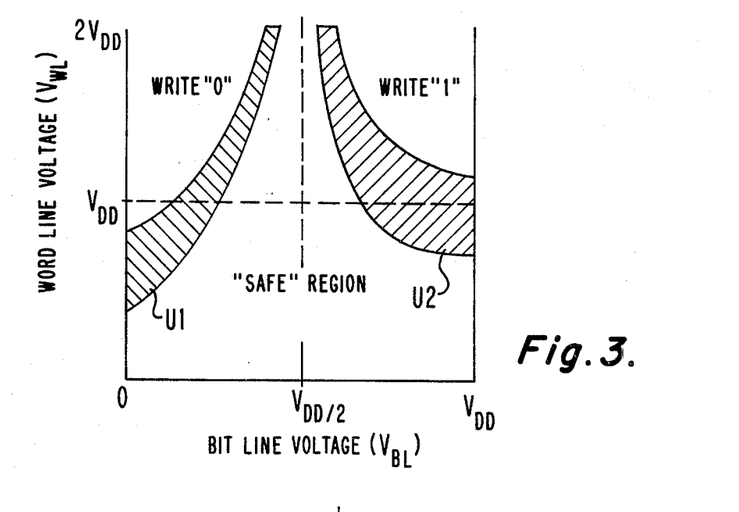
FIG. 3 is a graph of states assumed by a cell of the type shown in FIG. 2 in response to voltages applied to the bit and word lines.

(The general expression for the range of margin safety may be obtained by replacing $V_{DD}/2$ with $V_{FP}$.) Thus, for the value of $Z_{N3}$, $Z_{N1}$ and $Z_{P1}$ assumed above there is a safety margin of $\pm V_{DD}/8$, as determined and the ratios of $Z_{N3}$ to each of the impedances of the flip-flop transistors P1 and P2. $V_{BL}$ can be set within this margin of $V_{DD}/2$ without disturbing the memory cell even though $V_{DD}/2$ is the preferred level. This is shown in FIG. 3 where, for $V_{BL}$ at $V_{DD}/2$, the word line voltage applied to the gate electrode of N3 can be increased considerably above $V_{DD}$ volts (and $Z_{N3}$ decreased considerably) without disturbing the memory cell. Regions U1 and U2 in FIG. 3 define conditions for which the setting of the memory cell may vary due to variations in temperature, power supply voltages and the like. The lack of symmetry of the two regions is due to the gating transistor conducting in the source follower mode when turned on with node A low and $V_{BL}$ at or more positive than $V_A$, but conducting in the common source mode when node A is high and $V_{BL}$ is at or less positive than $V_A$. Maintaining the bit line at or near the flip point eliminates the problem of "false-write" or "disturb" of the unselected cells during the write or read mode. Furthermore, $Z_{N3}$ can be made a very small impedance without a disturb problem. Hence, N3 can be over-driven into conduction and information can be written safely and quickly into selected memory cells. Still further, the problem of disturbing the contents of the memory cell, during read, if $Z_{N3}$ is a small impedance is also eliminated. With $V_{BL}$ at $V_{DD}/2$, a cell selected for read will either raise the bit line level if storing a "1" or lower the bit line level if storing a "0", but $V_A$ will remain within safe limits. Hence, $Z_{N3}$ can safely be made a smaller impedance during read enabling faster read-out of the memory cell since more current can be sourced or sunk.

The greater freedom in the design of N3 enables the flip flop transistors to be designed as small as possible. Hence, a smaller cell can be designed enabling the design of higher density memory arrays.

It will also be shown below that precharging bit lines enable the much faster sensing of cell states. Sense amplifiers coupled to the bit lines are precharged to their mid point (highest gain and sensitivity) and are able to sense small excursion above or below the precharge point faster.

Referring back to the circuit of FIG. 1, each row of cells has a word line (W1 ... W128) connected to the gates (control) electrodes of the gating transistors of that row. And each column of cells has a bit line (B1 ... B128) connected to one end of the conduction paths of the gating transistors of that column. A READ/WRITE voltage generator 12 is coupled to a level shift and word line decoder circuit 14 to which address lines 16 also couple. The address line information is derived from the output of transition detection circuit 17 which has external input memory address line signals 18 applied thereto as inputs. The information on the address lines determines the rows selected for write or read. The address line data is decoded by the decoder portion of circuit 14 which couples the output of voltage generator 12 onto a selected one of the word lines (W1 ... W128). Voltage generator 12 is preferably of the type which produces on line 13 either a voltage of $V_{DD}$ volts during read or a voltage of $+2 V_{DD}$ volts during write. Such a circuit is shown, for example, in U.S. Pat. No. 4,000,412 and in a co-pending application of Applicant Andrew G. F. Dingwall titled MEMORY ORGANIZATION, filed on Aug. 7, 1978 and assigned Ser. No. 931,530 and need not be detailed. However, any other voltage generator which can produce suitable read and write voltages may be used to perform the function of generator 12. A preferred decoding and level shift arrangement is also shown in the above cited co-pending application of Andrew G. F. Dingwall. But, it should be understood that any one of a number of known decoding and level shift circuits may be used to perform the decoding and level shift function of circuit 14.

A precharge circuit ($20_1$ ... $20_{128}$) is connected to each bit line (B1 ... B128) of the array. The precharge circuits are turned on and off concurrently by means of a control line 22 to which is applied an appropriate precharge pulse derived from transistion detector 17. The precharge circuits ($20i$), where $1 \leq i \leq 128$, function to establish a predetermined voltage on the bit lines. By way of example, for cells with $V_{FP}$ at $V_{DD}/2$, the precharge circuits set the bit lines at approximately $V_{DD}/2$. A number of circuits capable of performing this function are shown in FIGS. 5-8 discussed below.

All the bit lines are fed to a bit line decoder 30 having 128 inputs, one input per bit line, and having 4 outputs which are connected to master bit lines MB1, MB2, MB3 and MB4. Decoder 30 includes 128 decoding gates (DGi) shown as being of the complementary transistor transmission gate type, one gate being connected between each bit line and one of 4 master bit lines. Decoding means (not shown) provide the enabling signals ($\phi_i$, $\bar{\phi}_i$) applied to the gate electrodes of the transmission gates. During read, four of the transmission gates are enabled (turned on) at a time thereby coupling 4 bit lines to the 4 master bit lines via the low "on" impedance of a complementary transistor transmission gate. Other types of known decoding arrangements may be used. However, the transmission gates provide a low bidirectional conduction path when ON, and a high OFF impedance. Whenever the memory array is read the contents of 4 cells are read out onto the master bit lines. Each master bit line is coupled to a sense amplifier which may be a simple complementary inverter of the type shown as $I_S$ in sense amplifier block 1 in FIG. 1. For the simple inverter shown in FIG. 1 the precharged bit line functions to charge the gate electrodes of transistors $P_S$ and $N_S$, which gate electrodes define the input of inverter $I_S$, to $V_{DD}/2$ volts when one of the decoder gates connected to master bit line 1 is enabled. When a selected cell is subsequently read by the turn on of its gating transistor, its associated master bit line voltage rises above $V_{DD}/2$ or falls below $V_{DD}/2$ giving a quick read-out of the cell contents. In this instance the precharge circuitry may thus be used to also precharge the sense amplifier input.

Figure 4:
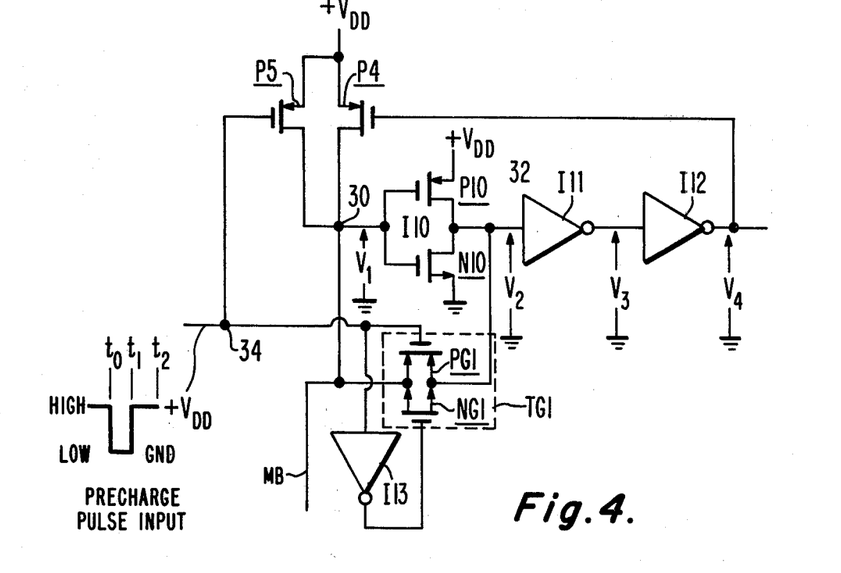
FIG. 4 is a schematic diagram of a sense amplifier which may be used in the circuit of FIG. 1.

The sense amplifiers may also be of the type shown in FIG. 4 and discussed in detail in co-pending application of Applicant Roger G. Stewart entitled Asymmetrically Precharged Sense Amplifier. The sense amplifier of FIG. 4 includes complementary transistors P10 and N10 forming inverter I10 which is connected at its input to a master bit line (MB). The conduction paths of transistors PG1 and NG1, forming a selectively enabled transmission gate TG1, are connected between the input and output of inverter I10. Transmission gate TG1, when enabled by a precharge pulse, couples the input and output of I10 via a relatively low impedance path. (In FIG. 4 the precharge pulse is shown as a negative going pulse but a positive going precharge pulse may be generated at the same time to drive the precharge circuits). Transistors P10 and N10 may have the same ratio to each other as transistors P1 and N1 of the memory cells have to each other. Hence, the transition point of inverter I10 (assumed to be $V_{DD}/2$) may be the same as that of inverter I1 of the memory cells. A transistor P5 whose conduction path is connected between $V_{DD}$ and the input of inverter I10 is responsive to a precharge pulse and charges the input of the inverter just above its transition point. The FIG. 4 sense amplifier also includes a transistor P4 for maintaining the inverter input charged after the termination of the precharge pulse. An advantage of precharging all the bit lines to a voltage which is equal to or close to the precharge level on the master bit lines is that it avoids the problem of charge redistribution when any of the decode gates in bit line decoder 30 are enabled. This allows the sense amplifier to respond almost instantaneously to information supplied to the bit lines from the memory cells. It should be appreciated that each sense amplifier only precharges the master bit line and the selected bit line connected to it. The unselected bit lines, which amount to 124 lines out of 128 for the example of FIG. 1, are unaffected by the sense amplifiers. In the absence of the precharge circuits $20_1$ ... $20_{128}$ the unselected bit lines would float anywhere between zero volts and $+V_{DD}$ volts giving rise to the problems discussed above.

Referring back to the precharge circuits, these circuits function to place all the bit lines at a predetermined voltage, or within a range of value, for which the memory cell will not be disturbed.

Figure 5:
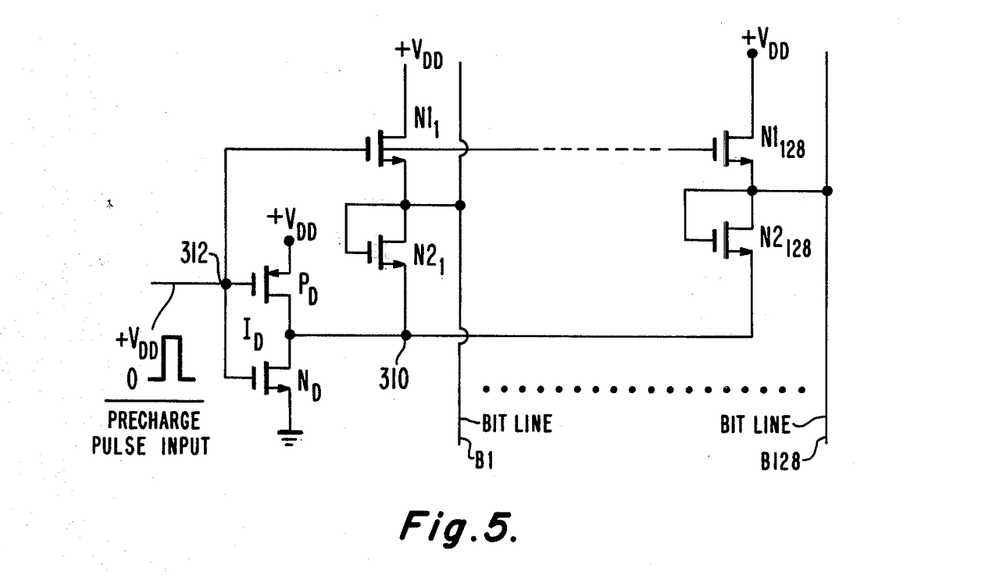
FIGS. 5, 6, 7 and 8 are different precharge circuits that may be used to practice the invention.

The precharge circuitry of FIG. 5 includes first (N1$_j$) and second (N2$_j$) IGFETs of the same conductivity type per bit line or column, where i takes on values from 1 to 128. The conduction paths of the first (e.g. N1$_j$) and second (e.g. N2$_j$) IGFETs associated with each bit line are connected in series between V$_{DD}$ and a common line 310 which is connected to the output of a driving inverter I$_D$. The gate electrodes of the first IGFET of each precharge circuits are connected in common with the input of inverter I$_D$ to precharge input terminal 312. The gate and drain electrodes of the second IGFET of each precharge circuit are connected in common with the source electrode of the first IGFET to its associated bit line. Inverter I$_D$ is comprised of transistors P$_D$ and N$_D$ of complementary conductivity type. Transistor N$_D$ is made very large compared to IGFETs N1$_i$ and N2$_i$, to provide a relatively low impedance path between line 310 and ground.

When the precharge pulse applied to input 312 is low, transistors N1$_i$ are turned off and P$_D$ is turned on applying V$_{DD}$ to line 310 and ensuring the turn off of the N2$_i$ transistors. The precharge circuits then appear as high impedances and have little effect on the bit lines. When the precharge pulse goes high (+V$_{DD}$), transistors N1$_i$ have +V$_{DD}$ volts applied to their gates as well as their drains and are turned on. Transistor N$_D$ is also turned on and clamps line 310 at, or close to, ground potential turning on the transistor N2$_i$ whose gates and drains are connected to respective ones of the sources of transistor N1$_i$. The conduction paths of respective pairs of transistors N1$_i$ and N2$_i$ are then connected in series between V$_{DD}$ and line 310 and, when the transistors N1$_i$ and N2$_i$ in each pair are of similar size, the bit line (BL) connected to the junction of their conduction paths get charged to a potential close to V$_{DD}$/2 volts. At equilibrium (bit lines at V$_{DD}$/2) the current through N1$_i$ is equal to the current through N2$_i$ and these transistors then have approximately equal V$_{GS}$'s and V$_{DS}$'s of V$_{DD}$/2. The drain-to-source conductances of transistors N1$_i$ and N2$_i$ will, therefore, be alike despite V$_{DD}$ variation and will reliably place the bit lines near V$_{DD}$/2.

Significant features of the precharge circuit of FIG. 3 are:

1. Only two transistors are required per (bit line) column of memory cells enabling the precharge circuit to fit on pitch with compact memory cells. This ensures a very compact layout (not shown) of the memory array.

2. Only the V$_{DD}$ line, the input line to the gates of transistors N1$_i$, and the common line 310 have to be routed to the precharge circuitry.

3. The use of N type transistors (N1$_i$, N2$_i$) having higher transconductance then comparably sized P-MOS transistors ensures rapid midpoint precharging. However, p-type transistors could be used instead of the N type with allowance made for the different polarity signals required to turn them on.

4. As long as V$_{DD}$ is greater than the sum of the threshold voltages (V$_T$'s) of transistors N1$_i$ and N2$_i$, the precharge circuit places the bit lines at a potential near V$_{DD}$/2 independent of the V$_T$'s of the transistors.

5. Once the precharge pulse is removed (i.e. point 312 returns low) the precharge circuit is rapidly decoupled from the bit line. IGFETs N1$_i$ with zero volts on their gate electrodes and V$_{DD}$/2 at their source electrodes (due to the capacitive precharged bit lines) are quickly and sharply turned off. Similarly IGFETs N2$_i$ with V$_{DD}$/2 volts at their gates and drains are quickly turned off when transistor P$_D$ is turned on and a potential of +V$_{DD}$ volts is applied to their source electrodes via line 310.

6. Transistors N1$_i$ conduct in the source follower mode and can supply relatively large initial currents onto the bit lines.

Figure 6:
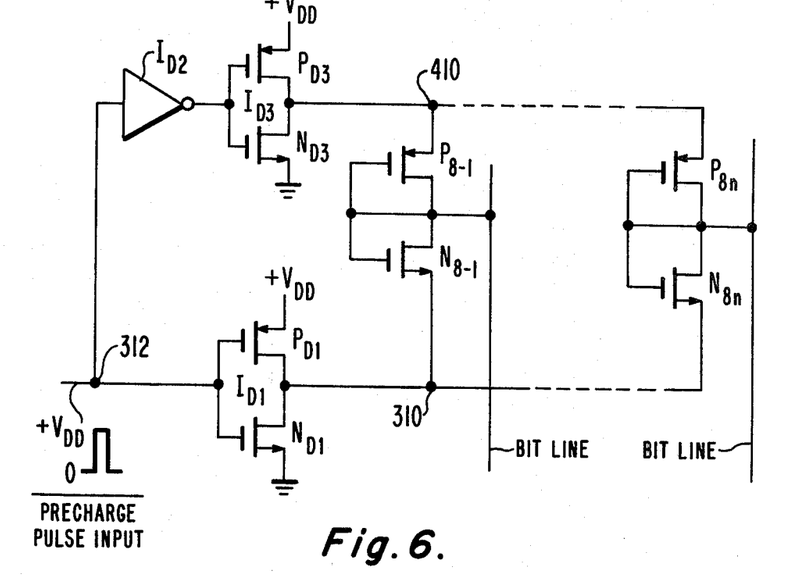

The circuit of FIG. 6 enables the setting of the bit line voltage closer to the transition point of the transistors forming the memory cell flip flop than does the circuit of FIG. 5. Two complementary transistors (P8$_i$ and N8$_i$) are required per bit line (column of memory cells). The two transistors have their conduction paths connected in series between common lines 410 and 310 to which are respectively applied +V$_{DD}$ volts and ground. The gates and drains of the two transistors are direct current (d.c.) connected in common and to the bit line. The ratio of transistors P8$_i$ to N8$_i$ may be the same as the ratio of the P transistors to the N transistors of inverter I1 and/or inverter I2 of the memory cells. This enables the precharge circuit to track the flip point of the memory cells of array 8 over a wide range of voltage, temperature, and other conditions.

Assuming $Z_{P8i}=Z_{N8i}$, the d.c. gate to drain connection sets their drain and gate potentials at a voltage which is one half the voltage applied between the two common lines. In response to a positive going precharge pulse at input terminal 312 transistor PD3 is turned on clamping line 410 at or close to, +V$_{DD}$ volts and transistor ND1 is turned on clamping line 310 at, or close to, ground. PD3 and ND1 are made very large in comparison to transistors P8$_i$ and N8$_i$ and are made to have similar impedances when carrying equal currents. Hence, the bit line voltage of each precharge circuit is at, or very close to, V$_{DD}$/2 volts.

Figure 7:
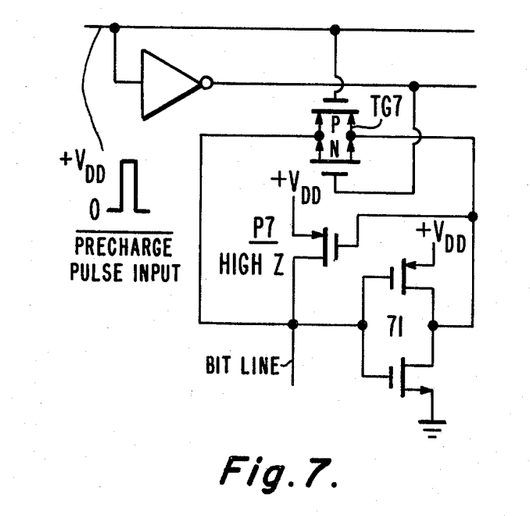

FIG. 7 is another precharge circuit suitable to practice the invention. An inverter 71 is connected at its input to a bit line. A transmission gate TG7 connected between the input and the output of inverter 71 provides a low impedance path therebetween in response to a precharge pulse charging the bit line to the transition point of the inverter. The conduction path of a high impedance ($Z_{P7}>>Z$ of TG7) transistor P7 is connected between V$_{DD}$ and the input to inverter 71. P7 has little, if any, effect on the precharge level. But, following precharge and read-out or write-in P7 provides a positive feedback path so that the bit line is not maintained at an intermediate level for which inverter 71 draws a continuous current.

Figure 8:
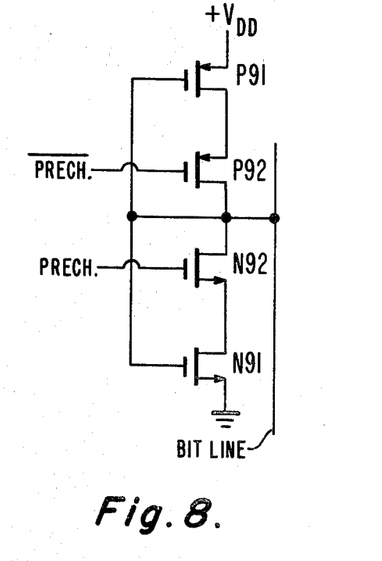

FIG. 8 is still another circuit for precharging the bit line to the transition point of a complementary inverter. The circuit includes two P type transistors P91, P92 having their conduction paths connected in series with two N type transistors (N91, N92) between V$_{DD}$ and ground. The conduction paths of the two P type transistors are connected in series between V$_{DD}$ and bit line, and the conduction paths of the two N type transistors are connected in series between the bit line and ground. During precharge, transistors P92 and N92 are switched-on by $\overline{\text{precharge}}$ and precharge, respectively. P91 and N91 having their gates connected in common to the bit line function as a self-biased inverter and the bit line is driven to the transition point of the inverter. For similar size P and N type transistors the bit line is driven to the mid point of the operating potential (V$_{DD}$/2).

What is claimed is:
1. The combination comprising:

a memory array of cells arranged in M rows and N columns, each cell having a flip point ($V_{FP}$) defining a level above which the cell is set to or stores one binary condition and below which the cell is set to or stores the other binary condition;

N bit lines, a bit line per column of cells, all the cells of a column being coupled to a bit line;

N precharge means, each one of said precharge means being connected to a different one of said bit lines, each one of said precharge means being enabled prior to the writing of information into, or the reading of information out of any of said cells, for precharging its associated bit line to a potential approximately equal to the voltage of said flip point;

X master bit lines, where X is smaller than N;

a bit line decoder circuit coupled between said N bit lines and said X master bit lines for selectively coupling the signals on X of said N bit lines to respective ones of said X master bit lines; and X sense amplifying means each one of said sense amplifying means being coupled to a different one of said X master bit lines.

2. The combination as claimed in claim 1 wherein each one of said precharge means includes a first transistor connected between its corresponding bit line and a first point of operating potential, and a second transistor connected between its corresponding bit line and a second point of operating potential.

3. The combination as claimed in claim 2 wherein said first and second transistors are of the same conductivity type.

4. The combination as claimed in claim 3 wherein the gate electrode of said first transistor is connected to an input terminal adapted to receive a precharge signal, wherein the source electrode of said first transistor is connected in common with the gate and drain electrodes of said second transistor to its corresponding bit line;

wherein the drain electrode of said first transistor is directly connected to said first point of potential; and wherein the source electrode of said second transistor is returned via a switching device to said second point of operating potential.

5. The combination as claimed in claim 2 wherein said first and second transistors are of complementary conductivity type and wherein the conduction path of a third transistor is connected in series with the conduction path of said first transistor between its corresponding bit line and said first point of operating potential, and wherein the conduction path of a fourth transistor is connected in series with the conduction paths of said second transistor between its corresponding bit line and said second point of operating potential.

6. The combination as claimed in claim 1 wherein each one of said memory cells has an input output (I/O) point and a gating transistor having a conduction path connected between the I/O point of the cell and its corresponding bit line.

7. The combination as claimed in claim 6 wherein each one of said memory cells includes first and second complementary inverters cross coupled to form a flip flop.

8. The combination as claimed in claim 1 wherein each one of said sense amplifying means precharges its corresponding master bit line to a first predetermined potential, and wherein said X master bit lines and X of said N bit lines selectively coupled to said X master bit lines are precharged by said sense amplifying means and by their corresponding precharge means and wherein the remaining ones of said N bit lines are precharged solely by their corresponding precharge means.

9. The combination comprising:

a memory cell having an input-output (I/O) point and having a flip point ($V_{FP}$) defining a level above which the cell is set to or stores a first binary condition and below which the cell is set to or stores a second binary condition; said memory cell having a first output impedance ($Z_1$) when at said first binary condition and having a second output impedance ($Z_2$) when at said second binary condition, and said cell including a gating transistor having a control electrode and having a conduction path connected between said I/O point and a bit line, the conduction path of said gating transistor when enabled having an impedance ($Z_3$); and means for precharging said bit line within a range of voltages prior to the enabling of said gating transistor to prevent disturbing the contents of the cell; said range of voltages being defined as: a) $V_{FP}$ minus the ratio of said third output impedance to said first output impedance multiplied by $V_{FP}$ [i.e. $V_{FP}-(Z_3/Z_1) V_{FP}$]; and $V_{FP}$ plus the ratio of said third output impedance to said second output impedance multiplied by $V_{FP}$ [i.e. $V_{FP}+(Z_3/Z_2) V_{FP}$].

10. The combination as claimed in claim 9 wherein said memory cell includes first and second inverters, each having an input and an output, wherein the output of said first inverter and the input of said second inverter are connected to said I/O point; and wherein the input of said first inverter and the output of said second inverter are connected in common.

11. The combination as claimed in claim 10 wherein each one of said first and second inverters includes first and second transistors of first and second conductivity type and wherein said gating transistor is of one of said first and second conductivity types.

12. The combination comprising:

a memory array of cells arranged in M rows and N columns, each cell having a flip point ($V_{FP}$) defining a level above which the cell is set to or stores one binary condition and below which the cell is set to or stores the other binary condition;

N bit lines, a bit line per column of cells, all the cells of a column being coupled to a bit line;

N precharge means, each one of said precharge means being connected to a different one of said bit lines, each one of said precharge means being enabled prior to the writing of information into, or the reading of information out of, any of said cells for precharging its associated bit line to a potential approximately equal to the voltage of said flip point.

13. The combination as claimed in claim 12 further including:

X master bit lines, where X is smaller than N;

a bit line decoder circuit coupled between said N bit lines and said X master bit lines for selectively coupling the signals on X of said N bit lines to respective ones of said X master bit lines; and X sense amplifying means each one of said sense amplifying means being coupled to a different one of said X master bit lines, each one of said X sense amplifying means including means for precharging the master bit line, to which it is connected, to a voltage which is approximately equal to that to which the bit lines are charged.

14. The combination as claimed in claim 13 wherein each one of said memory cells includes two cross coupled inverters forming a flip flop with the connection of the output of one inverter and the input of the other inverter defining the input-output (I/O) point of the flip-flop, and wherein each one of said cells further includes a single transistor having a conduction path and a control electrode, and wherein the conduction path of said single transistor is connected between said I/O point and the bit line associated with the cell.

* * * * *